(12) United States Patent
Wu

(10) Patent No.: US 12,438,086 B2
(45) Date of Patent: Oct. 7, 2025

(54) SEMICONDUCTOR PACKAGE AND METHOD OF FORMING THE SAME WITH DIELECTRIC LAYER DISPOSED BETWEEN PROTECTIVE MOLD STRUCTURE AND STEPPED STRUCTURE OF SIDE PORTION OF SEMICONDUCTOR DIE

(71) Applicant: CHENGDU ESWIN SYSTEM IC CO., LTD., Chengdu (CN)

(72) Inventor: Cheng-Tar Wu, Chengdu (CN)

(73) Assignee: Chengdu ECHINT Technology Co., Ltd., West Chengdu (CN)

( * ) Notice: Subject to any disclaimer, the term of this patent is extended or adjusted under 35 U.S.C. 154(b) by 184 days.

(21) Appl. No.: 17/848,779

(22) Filed: Jun. 24, 2022

(65) Prior Publication Data

US 2023/0317613 A1  Oct. 5, 2023

(30) Foreign Application Priority Data

Mar. 29, 2022 (CN) .......................... 202210319405.6

(51) Int. Cl.
H01L 23/532 (2006.01)
H01L 23/31 (2006.01)

(52) U.S. Cl.
CPC .... *H01L 23/53204* (2013.01); *H01L 23/3107* (2013.01)

(58) Field of Classification Search
CPC .................................................. H01L 23/53204
USPC ........................................................... 257/678
See application file for complete search history.

(56) References Cited

U.S. PATENT DOCUMENTS

| 2003/0011069 A1* | 1/2003 | Shibata | ................... H01L 24/05 257/737 |
| 2017/0162540 A1* | 6/2017 | Ji | ............................. H01L 24/13 |

FOREIGN PATENT DOCUMENTS

WO    WO-0207219 A1 *  1/2002  ........... H01L 21/563

* cited by examiner

*Primary Examiner* — Ajay Arora
(74) *Attorney, Agent, or Firm* — Scully, Scott, Murphy & Presser, P.C.

(57) ABSTRACT

In an embodiment, a semiconductor package is disclosed that includes a conductive material disposed in electrical contact with a semiconductor die, a protective mold structure disposed on the semiconductor die and a dielectric layer disposed on the semiconductor die and between the protective mold structure and the conductive material.

8 Claims, 14 Drawing Sheets

SEMICONDUCTOR PACKAGE AND METHOD OF FORMING THE SAME WITH DIELECTRIC LAYER DISPOSED BETWEEN PROTECTIVE MOLD STRUCTURE AND STEPPED STRUCTURE OF SIDE PORTION OF SEMICONDUCTOR DIE

BACKGROUND OF THE SPECIFICATION

The present disclosure relates to semiconductor packaging technology, and more particularly to semiconductor packages that have enhanced protection of semiconductor package conductive components and package reliability.

During a wafer reconstruction process for semiconductor packaging, an epoxy molding compound (EMC) layer is often formed in contact with a copper post formed on a die pad to connect the semiconductor package redistribution layer (RDL) to the underlying silicon die circuitry. The copper post is often exposed to grinding as the EMC layer is ground back after a molding process. This grinding may cause copper from the copper post to diffuse into the surrounding EMC material which may cause a short circuit or topography issue.

SUMMARY

In an embodiment, a semiconductor package is disclosed that comprises a conductive material disposed in electrical contact with a semiconductor die, a protective mold structure disposed on the semiconductor die and a dielectric layer disposed on the semiconductor die and between the protective mold structure and the conductive material.

In another embodiment, a method of fabricating a semiconductor package is disclosed that comprises forming a dielectric layer on a semiconductor die, forming a conductive material in electrical contact with the semiconductor die and forming a protective mold structure on the semiconductor die. The dielectric layer is disposed between the protective mold structure and the conductive material.

In another embodiment, a semiconductor package is disclosed that comprises a semiconductor die. The semiconductor die comprises semiconductor circuitry, a contact pad disposed on the semiconductor circuitry and in electrical contact with the semiconductor circuitry and a passivation layer disposed on the semiconductor circuitry and on at least a portion of the contact pad. The semiconductor package further comprises a dielectric layer disposed on the passivation layer and on a side portion of the semiconductor die, a conductive material disposed in electrical contact with the contact pad and a protective mold structure disposed on the semiconductor die and a portion of the dielectric layer. The dielectric layer is disposed between the protective mold structure and the conductive material.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
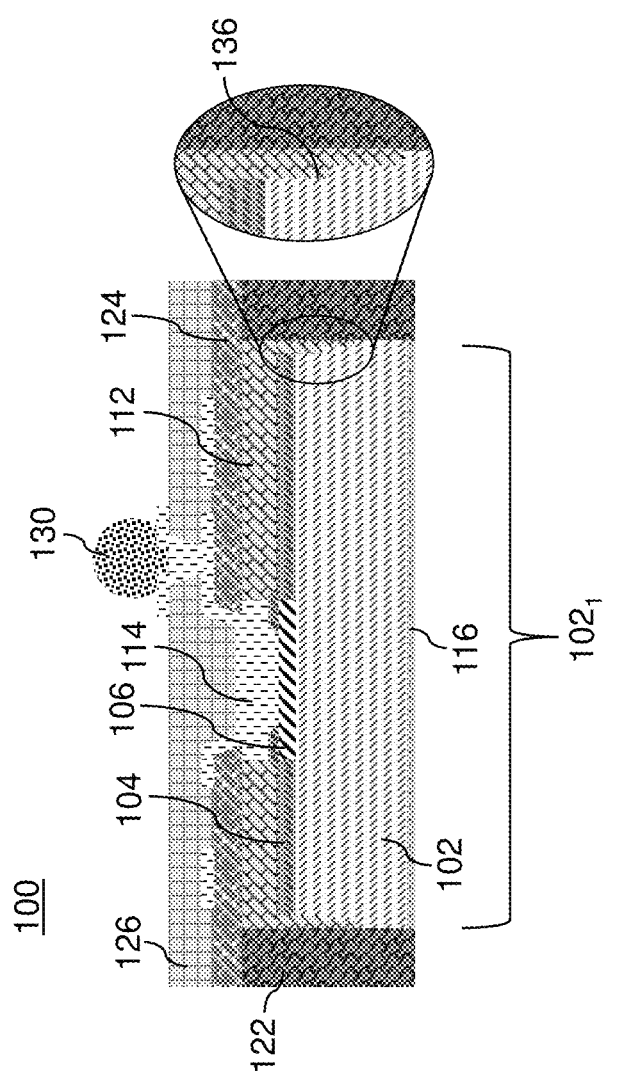
FIG. 1 illustrates a cross-sectional view of a semiconductor package according to an embodiment.

Illustrative embodiments will now be disclosed in greater detail with reference to the following description and the accompanying drawings. The drawings are provided for illustrative purposes only and, as such, the drawings are not drawn to scale. In the drawings, like and corresponding elements are referred to by like reference numerals.

In the following description, numerous specific details are set forth in order to provide an understanding of the various embodiments of the illustrative embodiments including examples of particular structures, components, materials, dimensions, processing steps and techniques. However, it will be appreciated by one of ordinary skill in the art that the illustrative embodiments disclosed herein may be practiced without these specific details. In other instances, well-known structures or processing steps have not been described in detail in order to avoid obscuring the illustrative embodiments.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With reference now to FIG. 1, a semiconductor package 100 according to an illustrative embodiment will be described.

Semiconductor package 100 comprises semiconductor circuitry 102 such as, e.g., a semiconductor die, integrated circuit, or other semiconductor circuitry. A conductive pad 106 is disposed in contact with semiconductor circuitry 102 and connects semiconductor circuitry 102 to a redistribution layer (RDL) 114 of semiconductor package 100. A passivation layer 104 is disposed on semiconductor circuitry 102 and at least partially on conductive pad 106. A first dielectric layer 112 is disposed on passivation layer 104 and at least partially on semiconductor circuitry 102 in a stepped arrangement 136. A protective mold structure 122 is disposed on a portion of semiconductor circuitry 102 and a portion of first dielectric layer 112. A second dielectric layer 124 is disposed on first dielectric layer 112, protective mold structure 122 and a portion of RDL 114 that is exposed by first dielectric layer 112. A third dielectric layer 126 is disposed on second dielectric layer 124 and portions of RDL 114. A conductor 130 is disposed on a portion of RDL 114 that is exposed by third dielectric layer 126.

Semiconductor package 100 comprises various features that improve the semiconductor packaging process and quality of the resulting semiconductor package. For example, first dielectric layer 112 provides semiconductor package 100 with a flat layer on which to form finer RDL features. In addition, the reliability of RDL 114 is improved by eliminating or inhibiting dielectric unevenness under the RDL. First dielectric layer 112 also ensures that RDL 114 is kept separate from protective mold structure 122 during a grinding process such that the material of RDL 114 is inhibited from diffusing into other parts of protective mold structure 122 which could potentially result in short circuit or topography issues. Die strength is also improved by the addition of stepped arrangement 136 which inhibits topside chipping and dielectric delamination induced by processes such as laser grooving or mechanical sawing. Stepped arrangement 136 also relaxes internal die stress. Stress on the extra low-k (ELK) dielectric layers of semiconductor circuitry 102 is also reduced during board level thermal cycling tests by protective mold structure 122 which provides a 5-side or full 6-side protection structure around semiconductor circuitry 102. Package drop test reliability is also improved by encapsulating all six sides of the die with tender dielectric materials and robust epoxy materials to eliminate potential low-k dielectric delamination.

Figure 2:
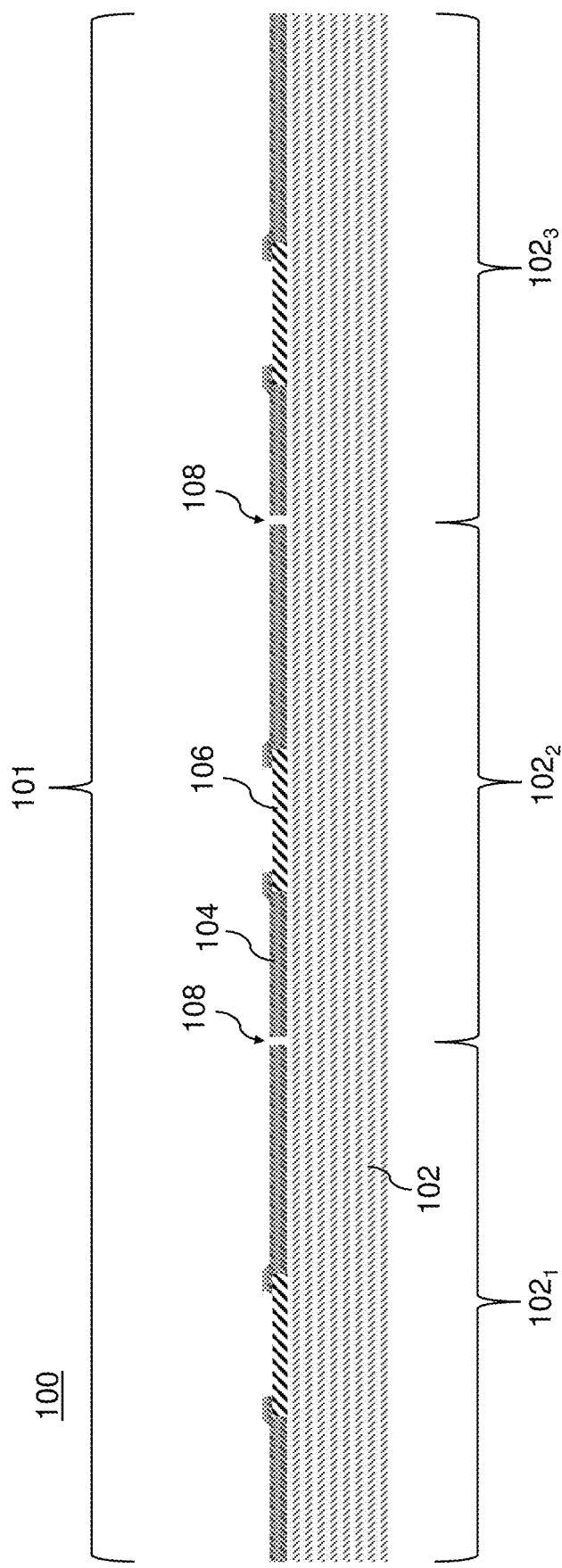
FIG. 2 illustrates a cross-sectional view of the semiconductor package of FIG. 1 at an intermediate stage of packaging fabrication illustrating a semiconductor wafer comprising semiconductor circuitry to be packaged according to an embodiment.

With reference to FIG. 2, semiconductor circuitry 102 comprises, e.g., a semiconductor die, semiconductor device, integrated circuit or any other semiconductor circuitry, that may be formed using commonly known techniques and processes and prepared for packaging along with conductive pad 106 and passivation layer 104 as a semiconductor wafer 101. Semiconductor circuitry 102 may comprise for example, a silicon (Si)-based substrate or any other material commonly used to form semiconductor circuitry. In some embodiments, semiconductor wafer 101 may comprise multiple units of semiconductor circuitry 102, e.g., units $102_1$, $102_2$ and $102_3$ semiconductor circuitry 102 each of which corresponds to a discrete semiconductor device or integrated circuit. While three units of semiconductor circuitry 102 are illustrated in FIG. 2, any other number of units of semiconductor circuitry 102 may be included in semiconductor wafer 101.

Conductive pad 106 may comprise, for example, a conductive material such as, e.g., copper (Cu), aluminum (Al) or any other conductive material that is formed in contact with semiconductor circuitry 102 using common processes that are typically performed during the fabrication of semiconductor wafer 101 prior to semiconductor packaging.

Passivation layer 104 may comprise, for example, a silicon oxide (SiOx), a silicon nitride (SiNx) or any other passivation material commonly formed on semiconductor wafers. Passivation layer 104 may be formed, for example, using common passivation techniques such as, e.g., thermal oxidation, chemical vapor deposition (CVD) or other passivation techniques.

With reference now to FIGS. 1 through 14, illustrative embodiments of a fabrication process for forming semiconductor package 100 will be described.

FIG. 2 illustrates a cross-sectional view of semiconductor package 100 at an intermediate stage of packaging fabrication. For example, as shown in FIG. 2, semiconductor wafer 101 may be obtained from a semiconductor fabricator. In some embodiments, semiconductor wafer 101 may comprise one or more cut lines, e.g., cut line 108 and 110, that are chemically or mechanically etched into passivation layer 104 between each unit of semiconductor circuitry $102_1$, $102_2$ and $102_3$, e.g., using common etching processes. For example, lithographic or other masking techniques may be utilized to define the location of cut lines 108 and 110 and directional etching techniques such as, e.g., reactive-ion etching (RIE), that are configured to etch passivation layer 104 selective to semiconductor circuitry 102 may be utilized to etch cut lines 108 and 110 either by the semiconductor fabricator or after semiconductor wafer 101 has been obtained from the semiconductor fabricator. Cut lines 108 and 110 define the locations on semiconductor wafer 101 where each unit of semiconductor circuitry 102 may be separated from the adjacent unit.

Figure 3:
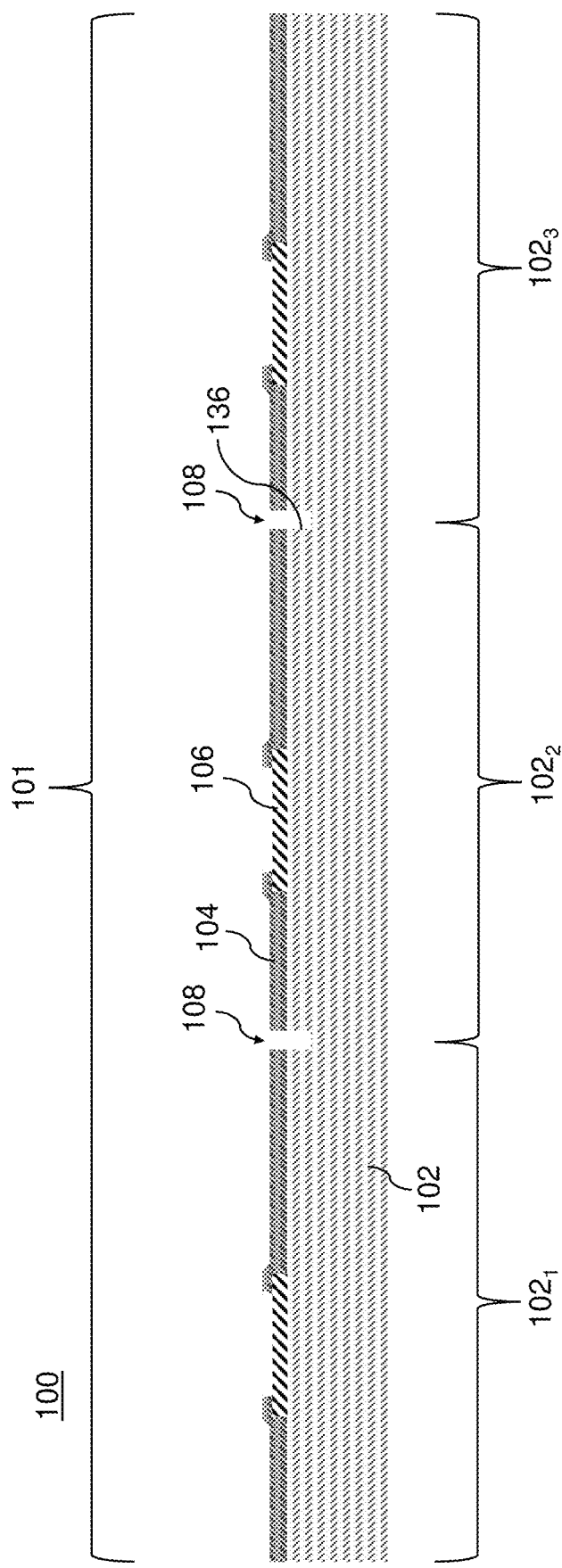
FIG. 3 illustrates a cross-sectional view of the semiconductor package of FIG. 2 at an intermediate stage of packaging fabrication after one or more mechanical or laser etching processes are utilized to etch cut lines at least partially into the semiconductor circuitry to form a stepped structure according to an embodiment.

FIG. 3 illustrates a cross-sectional view of semiconductor package 100 of FIG. 2 at an intermediate stage of packaging fabrication after one or more mechanical or laser etching processes are utilized to etch cut lines 108 and 110 at least partially into semiconductor circuitry 102 to form a stepped structure 136. For example, a laser grooving process may be used to etch cut lines 108 and 110 to a pre-determined depth as shown in FIG. 3. In some embodiments, the laser grooving process may also widen cut lines 108 and 110 by etching away an additional portion of passivation layer 104. In some embodiments, mechanical etching techniques may also or alternatively be used. For example, the etching may be performed using a diamond saw or another cutting tool.

Figure 4:
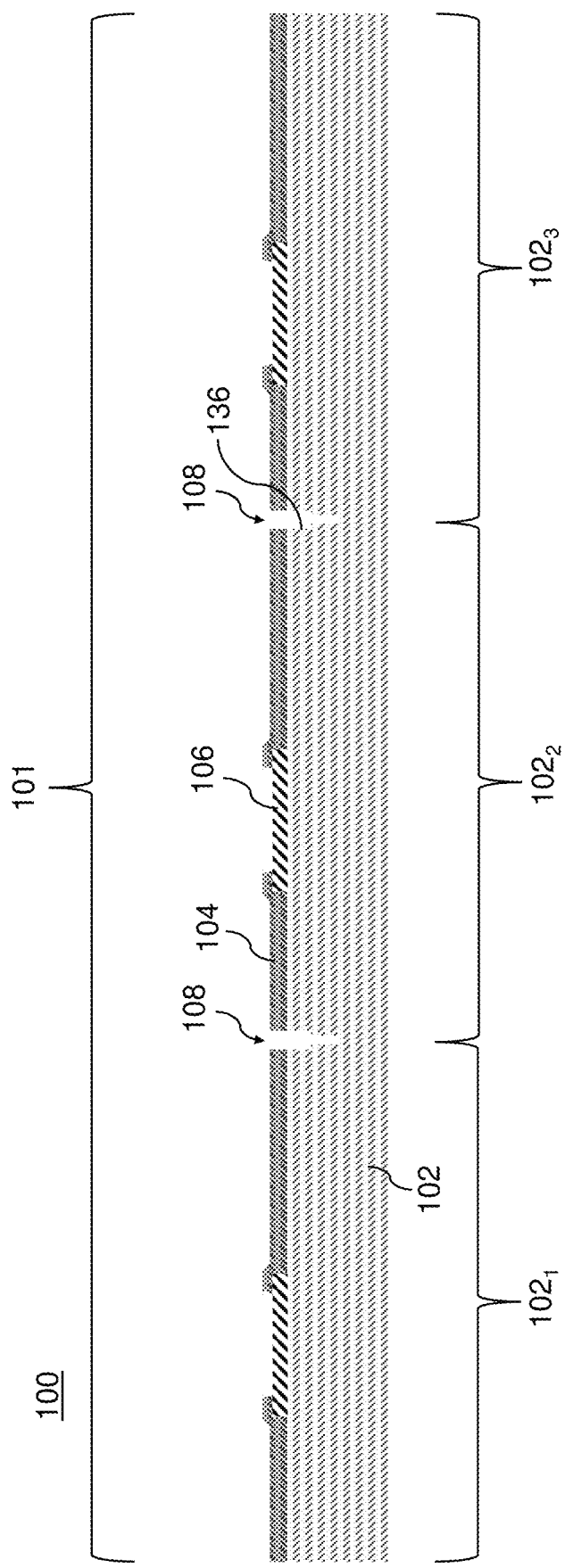
FIG. 4 illustrates a cross-sectional view of the semiconductor package of FIG. 3 at an intermediate stage of packaging fabrication after the cut lines are further etched into the semiconductor circuitry to form an additional step for the stepped structure according to an embodiment according to an embodiment.

FIG. 4 illustrates a cross-sectional view of semiconductor package 100 of FIG. 3 at an intermediate stage of packaging fabrication after cut lines 108 and 110 are further etched into semiconductor circuitry 102 to form an additional step for stepped structure 136 according to a further embodiment. For example, a further etching process, e.g., a laser grooving process or mechanical etching process, may be performed according to some embodiments. In some embodiments, an initial etching such as that show in FIG. 3 may be performed by the laser grooving and further etching such as that shown in FIG. 4 may be performed using a mechanical etching process or vice versa. In other embodiments, both etching steps may be performed by the same type of etching process, e.g., a laser grooving process, a mechanical etching process or another etching process. In some embodiments the initial etching may be wider than the further etching to define the additional step of stepped structure 136, as shown in FIG. 4. In other embodiments, the etching step of FIG. 4 may not be performed, with stepped structure 136 remaining as shown in FIG. 3.

Figure 5:
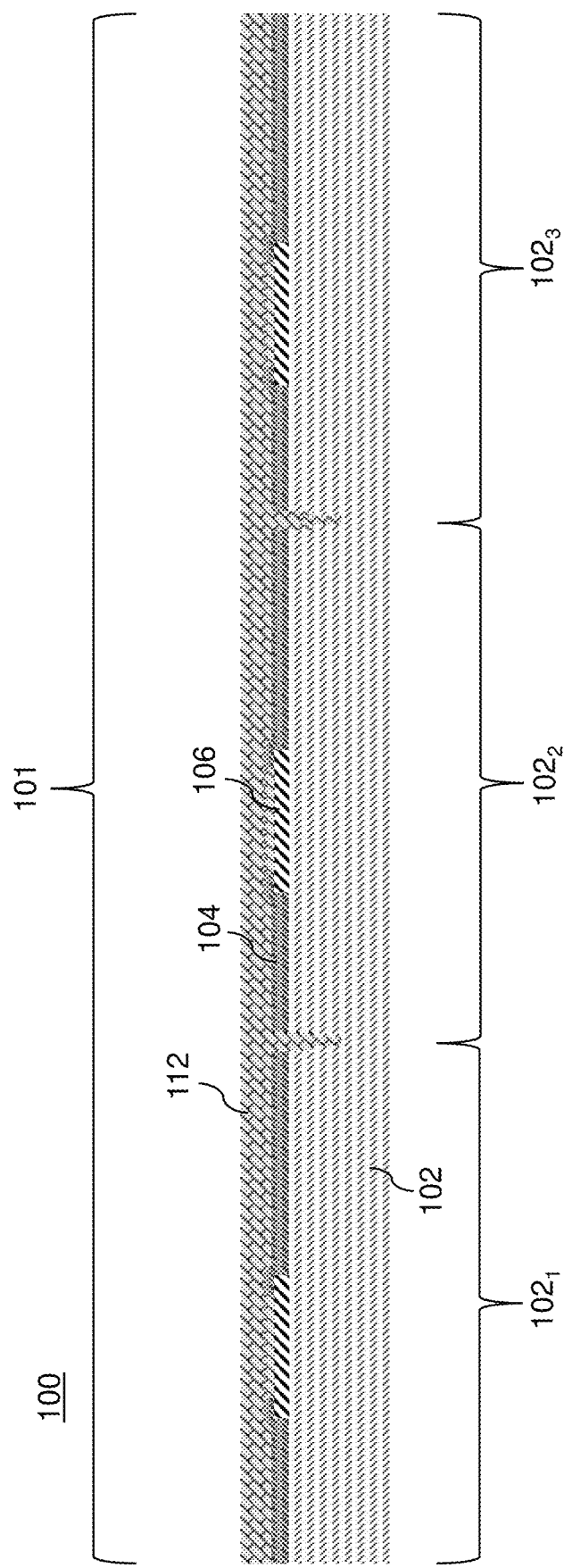
FIG. 5 illustrates a cross-sectional view of the semiconductor package of FIG. 4 at an intermediate stage of packaging fabrication after a first dielectric layer has been formed on the exposed surfaces of the semiconductor circuitry, passivation layer and conductive pads according to an embodiment according to an embodiment.

FIG. 5 illustrates a cross-sectional view of semiconductor package 100 of FIG. 4 at an intermediate stage of packaging fabrication after first dielectric layer 112 has been formed on the exposed surfaces of semiconductor circuitry 102, passivation layer 104 and conductive pads 106. For example, in some embodiments, first dielectric layer 112 may comprise a photosensitive dielectric material such as, e.g., Ajinomoto Build-up Film (ABF), photoresist (PR), photosensitive polyimides (PSPIs) or other photosensitive dielectric materials. In other embodiments, first dielectric layer 112 may comprise a non-photosensitive dielectric material such as, e.g., epoxy molding compound (EMC), underfill or other non-photosensitive dielectric materials. In some embodiments, first dielectric layer 112 may comprise any other suitable dielectric material such as, e.g., silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof.

First dielectric layer 112 may be formed using any suitable deposition techniques including chemical vapor deposition (CVD), atomic layer deposition (ALD), physical vapor deposition (PVD), plasma enhanced chemical vapor deposition (PECVD), chemical solution deposition or other deposition processes. First dielectric layer 112 may then be planarized by, for example, a planarization process such as a chemical mechanical planarization (CMP) process.

Figure 6:
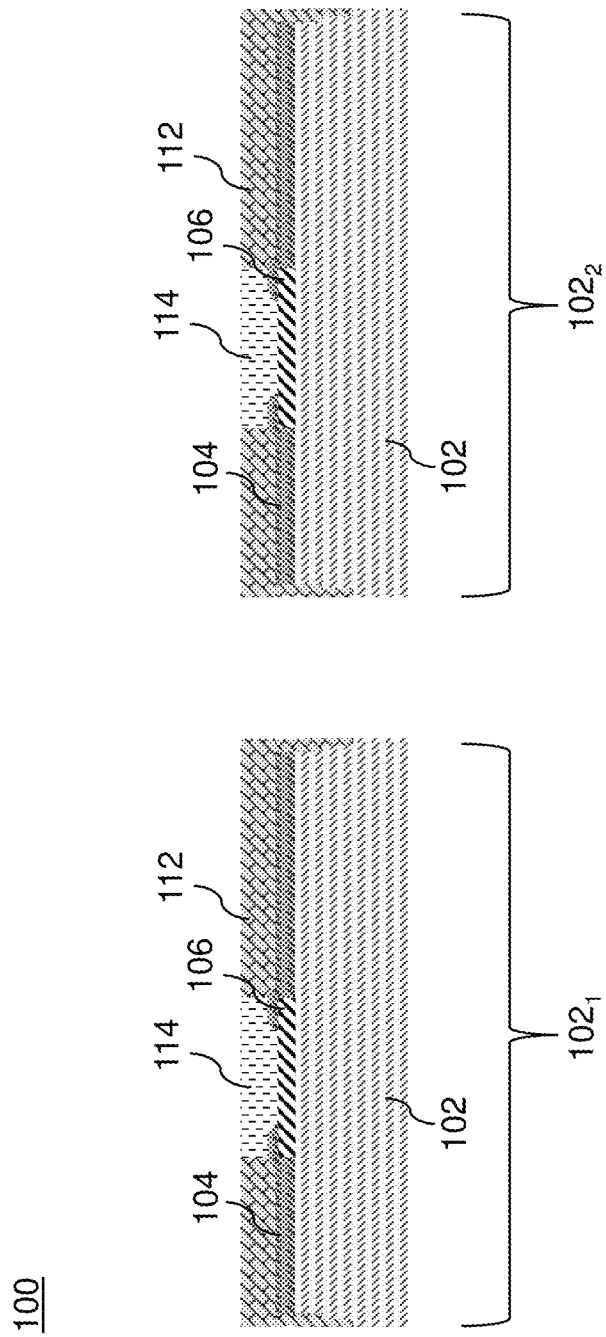
FIG. 6 illustrates a cross-sectional view of the semiconductor package of FIG. 5 at an intermediate stage of packaging fabrication after the first dielectric layer has been patterned and etched to expose portions of the passivation layer and conductive pads, the RDL has been deposited on the exposed portions of the passivation layer and in contact with the conductive pads, the RDL has been planarized to expose the first dielectric layer and the semiconductor wafer has been diced to separate each unit of semiconductor circuitry into individual units according to an embodiment.

FIG. 6 illustrates a cross-sectional view of semiconductor package 100 of FIG. 5 at an intermediate stage of packaging fabrication after first dielectric layer 112 has been patterned and etched to expose portions of passivation layer 104 and conductive pads 106, RDL 114 has been deposited on the exposed portions of passivation layer 104 and in contact with conductive pads 106, RDL 114 has been planarized to expose first dielectric layer 112 and semiconductor wafer 101 (FIG. 5) has been diced to separate each unit of semiconductor circuitry 102 into the individual units, e.g., units $102_1$, $102_2$, etc.

First dielectric layer 112 may be patterned, e.g., using known lithographic or other masking techniques, and etched using etching techniques such as, e.g., RIE, that are configured to etch first dielectric layer 114 selective to passivation layer 104 and conductive pads 106 to expose portions of passivation layer 104 and conductive pads 106 in the patterned regions as shown in FIG. 6. RDL 114 may be deposited using a suitable deposition process such as, e.g., CVD, PECVD, PVD, plating, thermal or e-beam evaporation, sputtering, or other deposition processes. In some embodiments the deposition may be conformal. In some embodiments, RDL 114 may be formed as a thermal copper pillar bump (CPB). Following deposition, RDL 114 may be planarized using a process such as, e.g., CMP, to expose first dielectric layer 112.

Semiconductor wafer 101 (FIG. 5) may be diced to separate each unit of semiconductor circuitry 102 into the individual units, e.g., units $102_1$, $102_2$, etc. using one or more standard processes. For example, semiconductor wafer 101 may be laminated with an ultraviolet curable back-grinding tape and a back-grinding (BG) process may be utilized to grind or thin down semiconductor wafer 101 to a target thickness to prepare semiconductor circuitry 102 for dicing into the individual units $102_1$, $102_2$, etc. Semiconductor wafer 101 may be diced to separate units $102_1$, $102_2$, etc. of semiconductor circuitry 102 using common dicing processes including, e.g., scribing, breaking, mechanical sawing, laser cutting, plasma cutting or any other dicing process.

While FIGS. 6-14 only show units $102_1$ and $102_2$ of semiconductor circuitry 102 after dicing for the sake of clarity, similar processes may also be performed on the other units of semiconductor circuitry 102.

Figure 7:
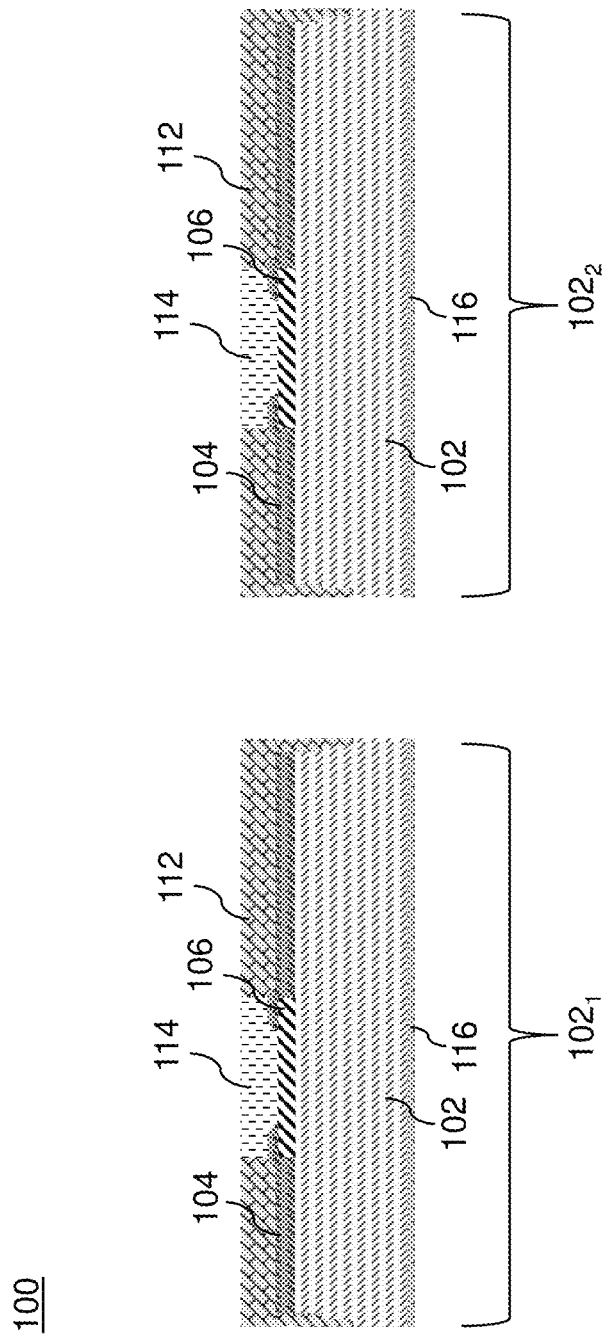
FIG. 7 illustrates a cross-sectional view of the semiconductor package of FIG. 6 at an intermediate stage of packaging fabrication after an attachment layer has been added to a bottom of the semiconductor circuitry for each of the units according to an embodiment.

FIG. 7 illustrates a cross-sectional view of semiconductor package 100 of FIG. 6 at an intermediate stage of packaging fabrication after an attachment layer 116 such as, e.g., a die-attach film (DAF) or adhesive, has been added to a bottom of semiconductor circuitry 102 for each of units $102_1$ and $102_2$.

Figure 8:
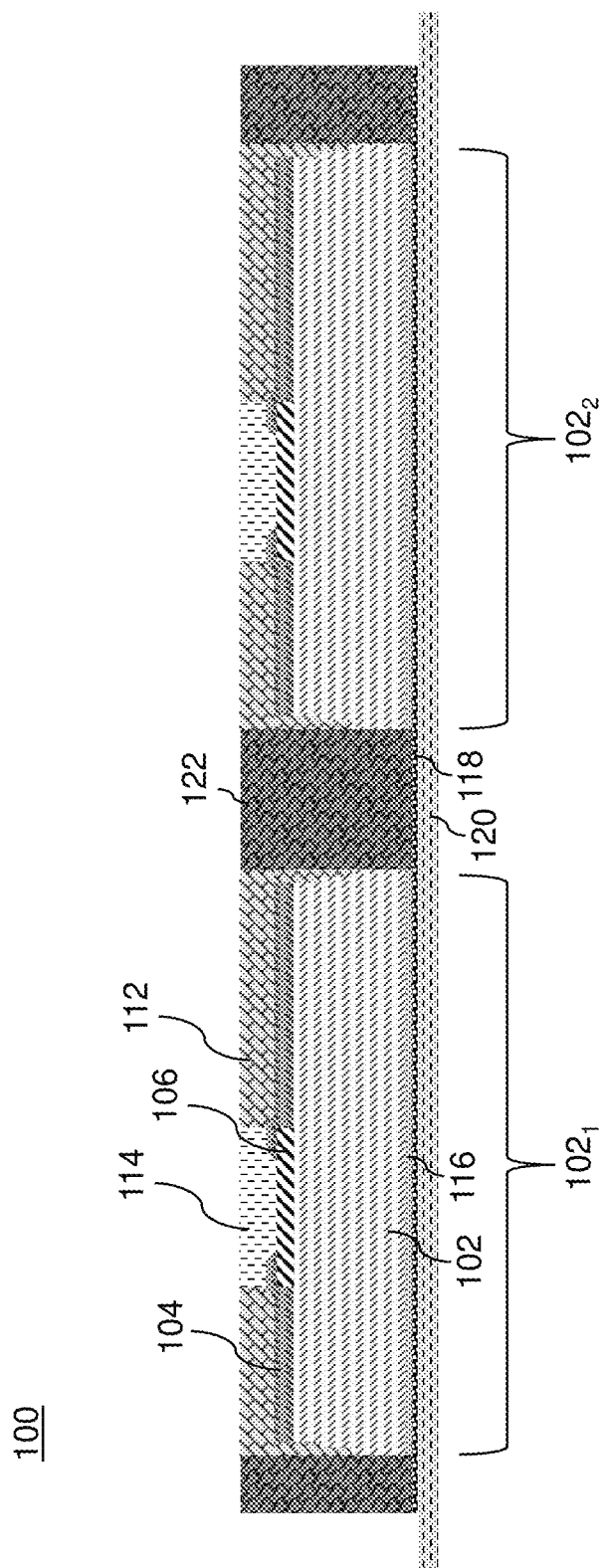
FIG. 8 illustrates a cross-sectional view of the semiconductor package of FIG. 7 at an intermediate stage of packaging fabrication after the units are attached to a release layer by the attachment layer and a molding process is used to form a protective mold structure on the semiconductor package according to an embodiment.

FIG. 8 illustrates a cross-sectional view of semiconductor package 100 of FIG. 7 at an intermediate stage of packaging fabrication after units $102_1$ and $102_2$ are attached to a release layer 118 by attachment layer 116 and a molding process is used to form protective mold structure 122 on semiconductor package 100. Release layer 118 may comprise, for example, a temporary bonding material, a removable tape or any other material. Release layer 118 is attached to a substrate 120 that forms a structure for mounting units $102_1$ and $102_2$ of semiconductor circuitry 102 during the packaging process. In some embodiments, protective mold structure 122 may be over molded on semiconductor package and then planarized using a process such as, e.g., grinding, CMP or another process, to expose first dielectric layer 112 and RDL 114.

Figure 9:
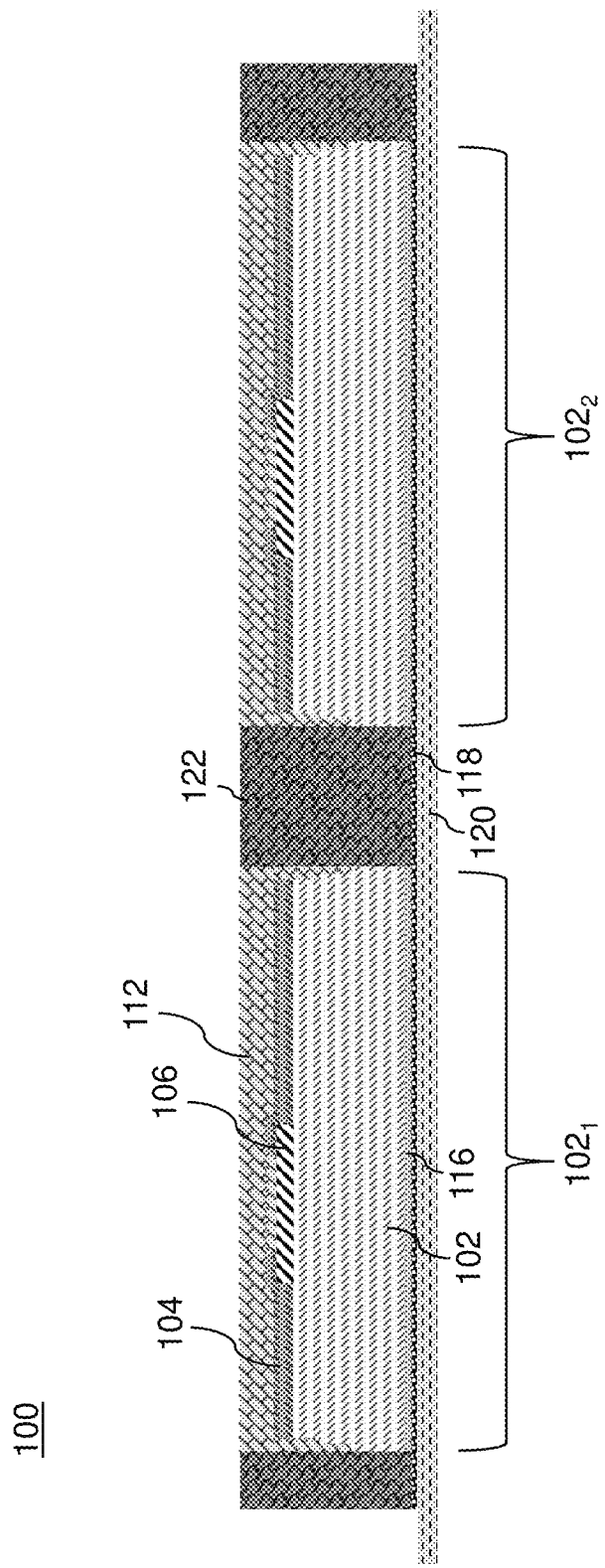
FIG. 9 illustrates a cross-sectional view of the semiconductor package of FIG. 5 at an intermediate stage of packaging fabrication according to another embodiment.

FIG. 9 illustrates a cross-sectional view of semiconductor package 100 of FIG. 5 at an intermediate stage of packaging fabrication according to another embodiment. In this embodiment, starting with semiconductor package 100 as shown in FIG. 5, units $102_1$ and $102_2$ are separated and attached to release layer 118 by attachment layer 116 as described above without first patterning first dielectric layer 112 or depositing RDL 114. The molding process is then used to form protective mold structure 122 on semiconductor package 100 as shown in FIG. 9. Protective mold structure 122 may be planarized, e.g., using grinding, CMP or another process, to expose first dielectric layer 112. In an illustrative embodiment, after the packaging fabrication process of FIG. 9, first dielectric layer 112 may be patterned and etched to expose passivation layer 104 and conductive pad 106 and RDL 114 may be deposited in a similar manner to that described above for FIG. 6, resulting in the semiconductor package 100 shown in FIG. 8.

Figure 10:
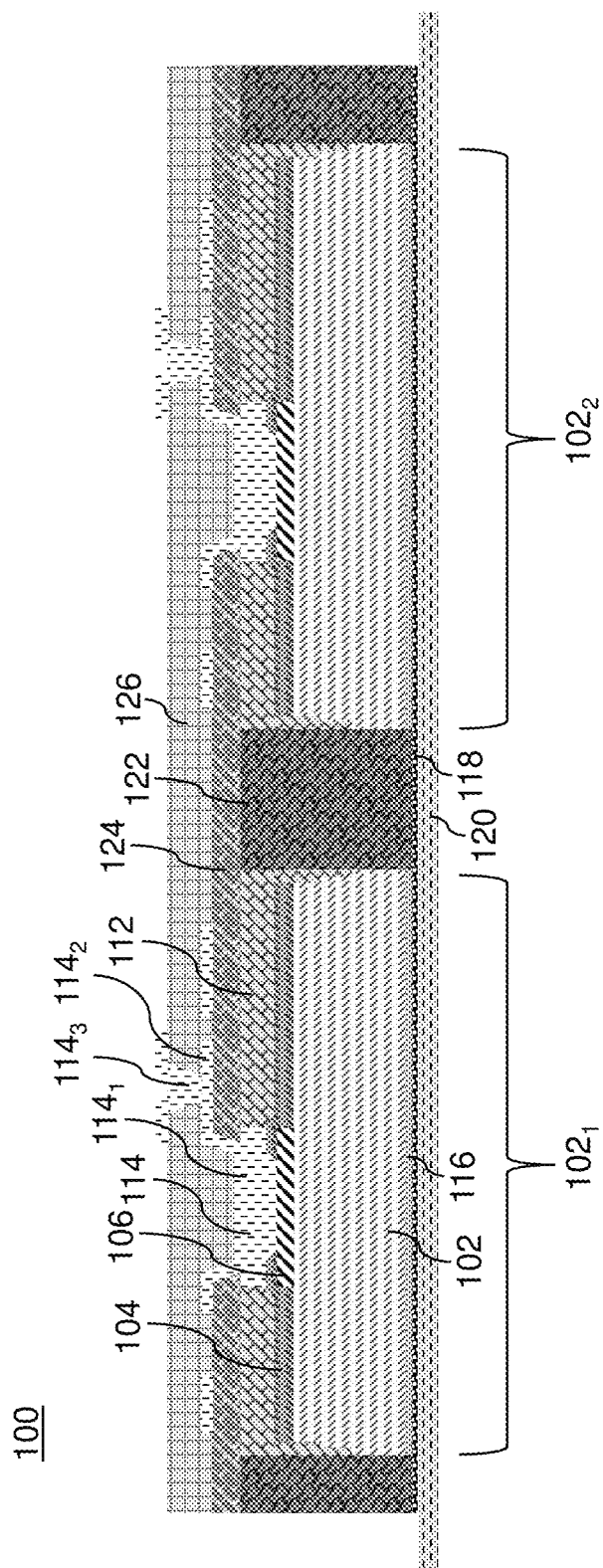
FIG. 10 illustrates a cross-sectional view of the semiconductor package of FIG. 8 at an intermediate stage of packaging fabrication after the deposition, patterning and etching of a second dielectric layer, the deposition, patterning and etching of a first additional layer of the RDL, the deposition, patterning and etching of a third dielectric layer, and the deposition, patterning and etching of a second additional layer of the RDL according to an embodiment.

FIG. 10 illustrates a cross-sectional view of semiconductor package 100 of FIG. 8 at an intermediate stage of packaging fabrication after the deposition, patterning and etching of second dielectric layer 124, the deposition, patterning and etching of an additional layer $114_2$ of RDL 114, the deposition, patterning and etching of third dielectric layer 126, and the deposition, patterning and etching of an additional layer $114_3$ of RDL 114. Second dielectric layer 124 and third dielectric layer 126 may comprise similar materials to and may be formed, patterned and etched using similar techniques to those described above for first dielectric layer 124. In some embodiments, a coat, expose and develop process may be utilized to pattern and etch second and third dielectric layers 124 and 126, e.g., in a case where second and third dielectric layers 124 and 126 comprise photosensitive dielectric materials. Additional portions $114_2$ and $114_3$ of RDL 114 may be deposited using techniques such as those described above for the deposition of RDL 114.

Second dielectric layer 124 is deposited on first dielectric layer 112, RDL 114 and protective mold structure 122 followed by patterning and etching to expose a first portion $114_1$ of RDL 114. The etching of second dielectric layer 124 may be selective to the material of RDL 114. In an embodiment where second dielectric layer 124 comprises a photosensitive material, a coat, expose and develop process may be utilized to pattern and etch second dielectric layer 124. In an embodiment where second dielectric layer 124 comprises a non-photosensitive material, a drilling or other etching process may be utilized to etch second dielectric layer 124.

Layer $114_2$ of RDL 114 is deposited on portion $114_1$ of RDL 114 and on second dielectric layer 124 using the above described deposition techniques. Layer $114_2$ of RDL 114 is patterned using similar techniques to those described above for first and second dielectric layers 112 and 124 and etched according to the pattern using a standard etching process such as, e.g., RIE. For example, the pattern may define the pathways or connections to be made by layer $114_2$ of RDL 114. The etching may be selective to the material of second dielectric layer 124.

Third dielectric layer 126 is deposited on second dielectric layer 124 and layer $114_2$ of RDL 114 followed by patterning and etching to expose a portion of layer $114_2$ of RDL 114, e.g., the portion shown as being disposed under layer $114_3$ of RDL 114 in FIG. 10. The etching of third dielectric layer 124 may be selective to the material of RDL 114. In an embodiment where third dielectric layer 126 comprises a photosensitive material, a coat, expose and develop process may be utilized to pattern and etch third dielectric layer 126. In an embodiment where third dielectric layer 126 comprises a non-photosensitive material, a drilling or other etching process may be utilized to etch third dielectric layer 126.

Layer $114_3$ of RDL 114 is deposited on the exposed portion of layer $114_2$ of RDL 114 and on third dielectric layer 126 using the above described deposition techniques. Layer $114_3$ of RDL 114 is patterned and etched using similar techniques to those described above for layer $114_2$ of RDL. For example, the pattern may define the pathways or connections to be made by layer $114_3$ of RDL 114. The etching may be selective to the material of third dielectric layer 126.

Figure 11:
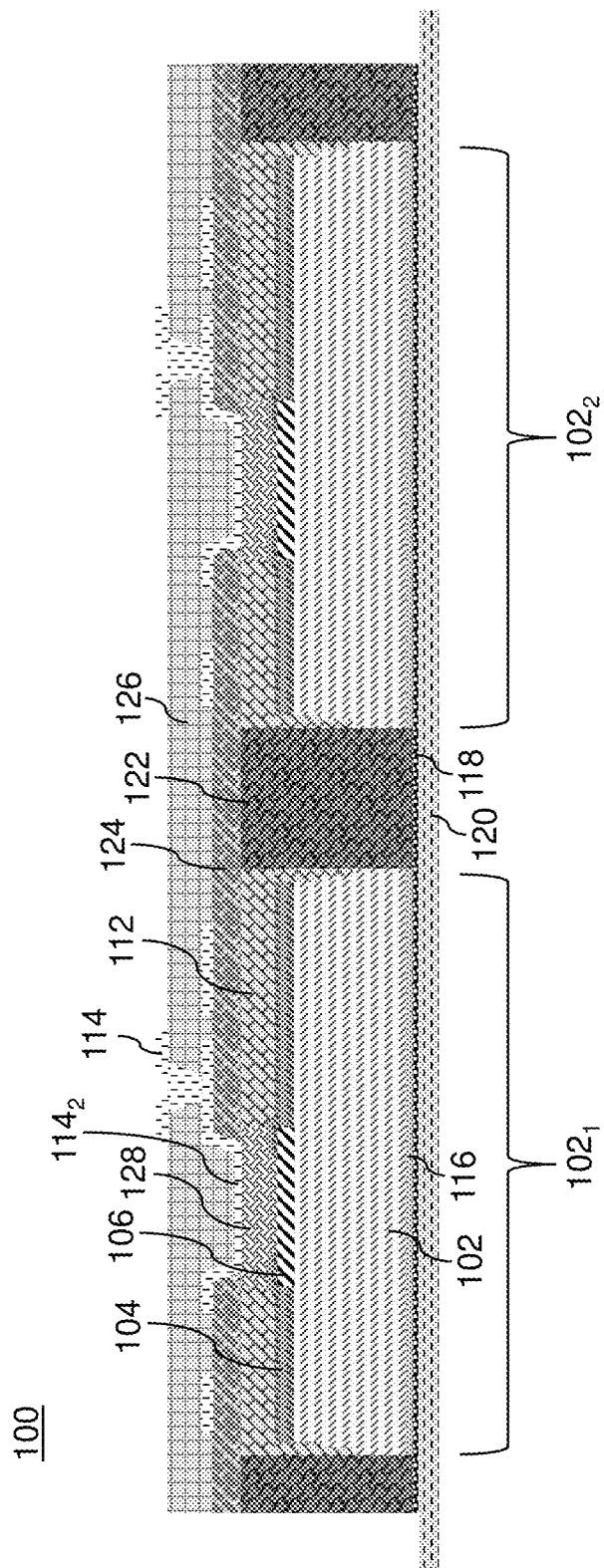
FIG. 11 illustrates a cross-sectional view of the semiconductor package at an intermediate stage of packaging fabrication similar to that of FIG. 10 comprising a conductive paste according to another embodiment.

FIG. 11 illustrates a cross-sectional view of semiconductor package 100 according to another embodiment at an intermediate stage of packaging fabrication similar to that of FIG. 10. In this embodiment, portion $114_1$ (FIG. 10) of RDL 114 is instead formed of a conductive paste 128 such as, e.g., a metal-based paste or another conductive paste, with layer $114_2$ of RDL 114 being deposited on conductive paste 128.

Figure 12:
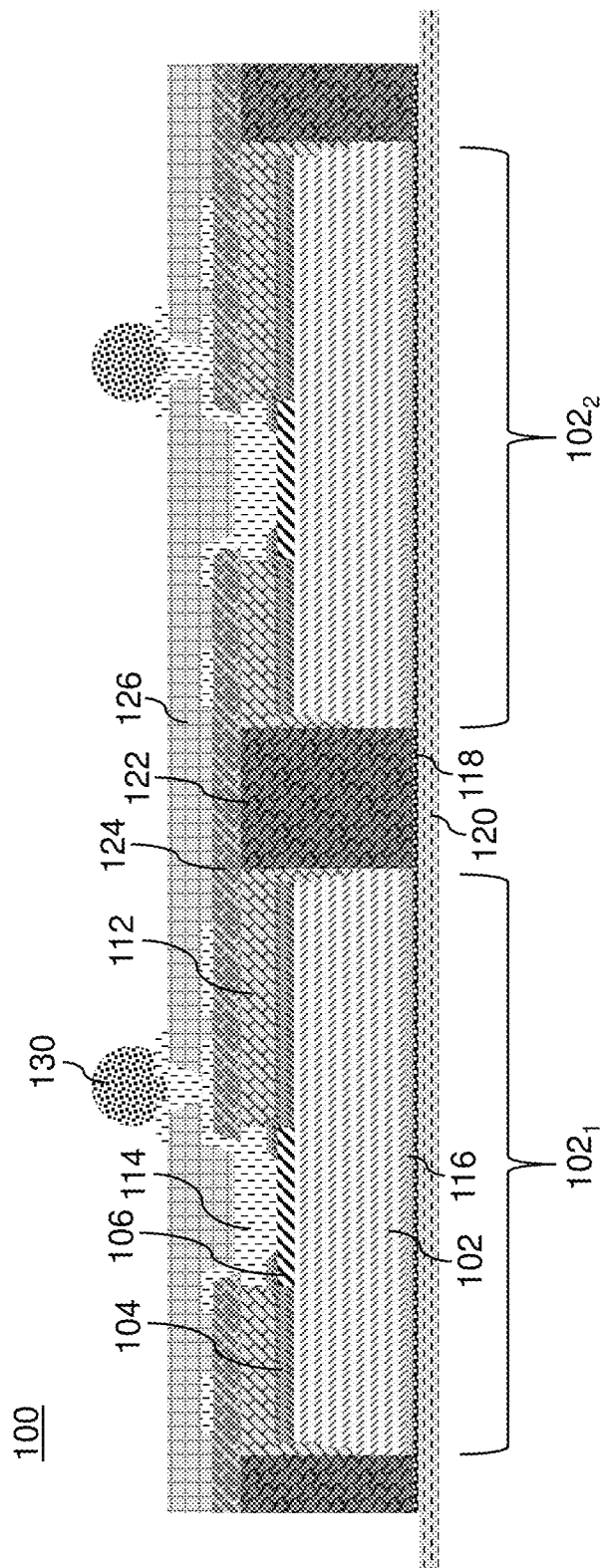
FIG. 12 illustrates a cross-sectional view of the semiconductor package of FIG. 10 at an intermediate stage of packaging fabrication after the formation of conductors on the exposed portion of the second additional layer of the RDL according to an embodiment.

FIG. 12 illustrates a cross-sectional view of semiconductor package 100 of FIG. 10 at an intermediate stage of packaging fabrication after the formation of conductors 130 on the exposed portion of layer $114_3$ of RDL 114. Conductors 130, also sometimes referred to as connectors or conductive terminals, are configured to electrically connect RDL 114 to the electrical connections of a device that will utilize semiconductor package 100. Conductors 130 may comprise, for example, solder balls, controlled collapse chip connection (C4) bumps, ball grid array (BGA) connectors, combinations thereof or other conductive elements. Conductors 130 may comprise materials such as, e.g., copper, aluminum, lead-free alloys (e.g., gold, tin, silver, aluminum, or copper alloys), lead alloys (e.g., lead-tin alloys) or other materials suitable for use as conductors for electrically connecting RDL 114 to the electrical connections of a device that will utilize semiconductor package 100.

Figure 13:
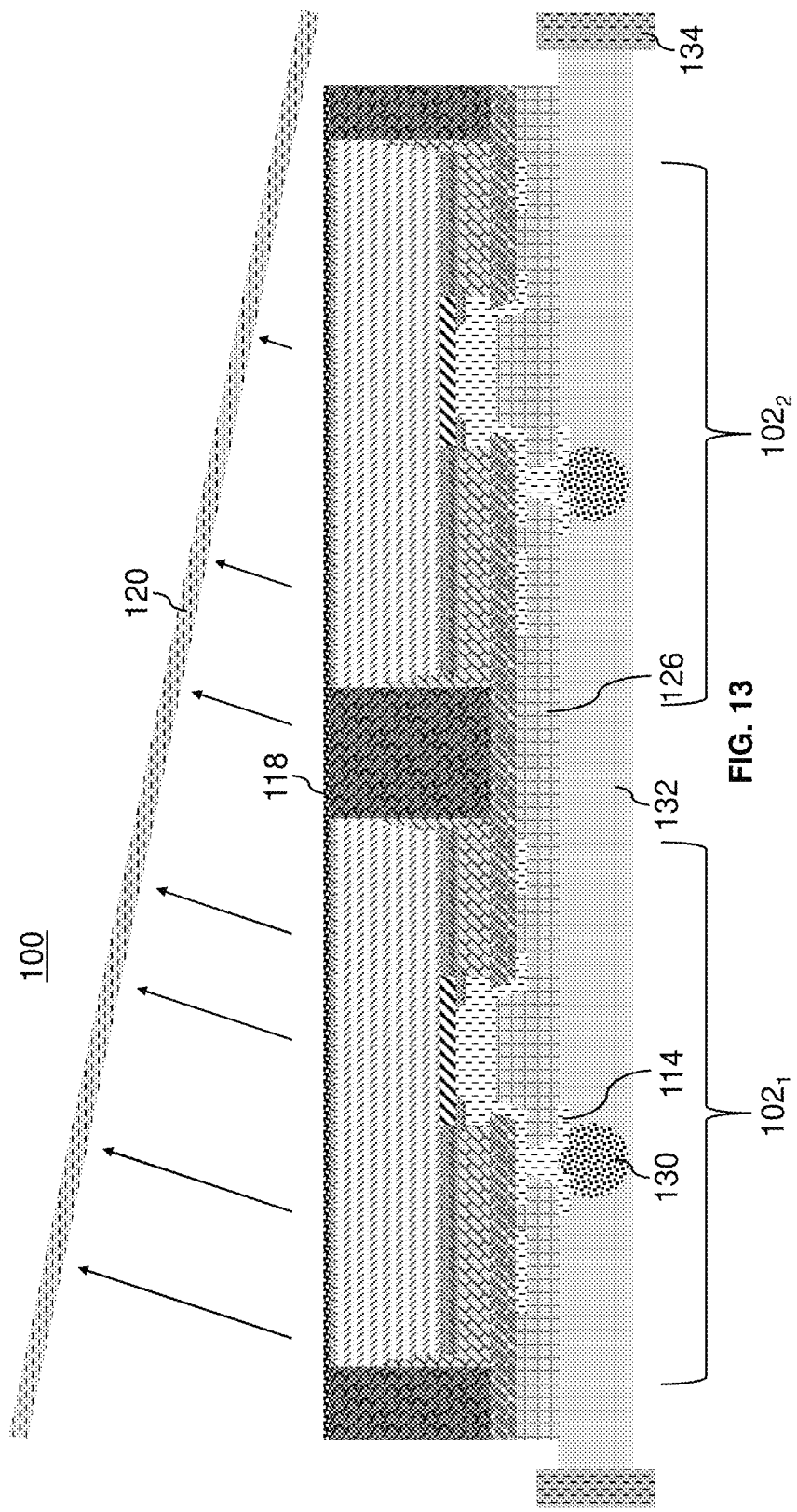
FIG. 13 illustrates a cross-sectional view of the semiconductor package of FIG. 12 at an intermediate stage of packaging fabrication after forming a protective layer over the conductors, the RDL and the third dielectric layer, forming support structures on the protective layer and removing the substrate from the release layer according to an embodiment.

FIG. 13 illustrates a cross-sectional view of semiconductor package 100 of FIG. 12 at an intermediate stage of packaging fabrication after forming a protective layer 132 over conductors 130, RDL 114 and third dielectric layer 126, forming support structures 134 on protective layer 132 and removing substrate 120 from release layer 118.

Protective layer 132 may comprise, for example, a dielectric material, EMC or any other material that may be utilized to protect conductors 130 and RDL 114 during a de-bonding process. Support structures 134 may comprise, for example, EMC or another material that may be used to support semiconductor package 100, e.g., when flipped for removal of substrate 120 from release layer 118. Protective layer 132 and support structures 134 may be formed using any of the above described techniques for forming first dielectric layer 112, EMC 122 or other portions of semiconductor package 100. Substrate 120 may be debonded from release layer 118 using one or more common debonding techniques such as, e.g., chemical debonding, slide debonding, mechanical debonding and laser debonding.

Figure 14:
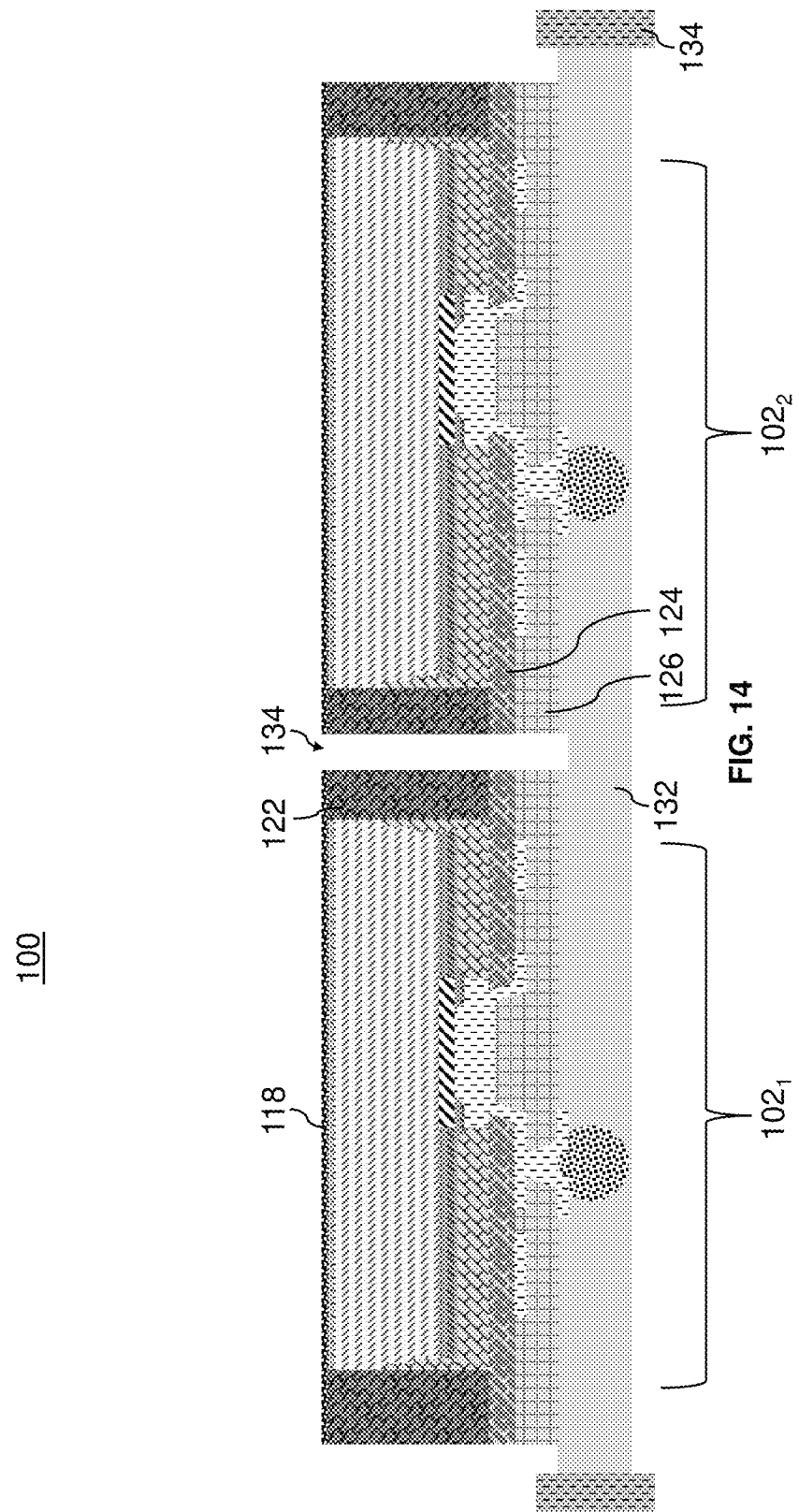
FIG. 14 illustrates a cross-sectional view of the semiconductor package of FIG. 13 at an intermediate stage of packaging fabrication after an etching or cutting process is performed to cut a channel between the units of the semiconductor circuitry down to the protective layer through the release layer, the protective mold structure, the second dielectric layer and the third dielectric layer according to an embodiment.

FIG. 14 illustrates a cross-sectional view of semiconductor package 100 of FIG. 13 at an intermediate stage of packaging fabrication after an etching or cutting process is performed to cut a channel 134 between units $102_1$ and $102_2$ of semiconductor circuitry 102 down to protective layer 132 through release layer 118, protective mold structure 122, second dielectric layer 124, and third dielectric layer 126. In some embodiments the etching or cutting process may be performed using any of the chemical or mechanical techniques described above including, e.g., patterning and etching using RIE or another etching technique, mechanical cutting using a saw, laser cutting, or any other method of etching or cutting.

Further processes may be utilized to remove protective layer 132 and support structures 134 to achieve semiconductor package 100 as shown in FIG. 1. For example, in some embodiments, protective layer 132 and support structures 134 may be removed using one or more etching or other processes. For example, a directional etching process such as, e.g., RIE, that is selective to RDL 114, third dielectric layer 126 and conductors 130 may be utilized to remove protective layer 132 and support structures 134. In another example, a non-directional chemical etching process that is selective to any other exposed surfaces of semiconductor package 100, e.g., RDL 114, attachment layer 116, protective mold structure 122, third dielectric layer 126 and conductors 130, may be utilized to remove protective layer 132 and support structures 134.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor package comprising:
   a conductive material disposed in electrical contact with a semiconductor die;
   a protective mold structure disposed on the semiconductor die; and
   a dielectric layer disposed on the semiconductor die and between the protective mold structure and the conductive material,
   wherein the dielectric layer is disposed on a top portion of the semiconductor die and on a stepped structure including a first step etched in a side portion of the semiconductor die, and
   wherein the dielectric layer is disposed between the protective mold structure and the stepped structure of the side portion of the semiconductor die.

2. The semiconductor package of claim 1,
   wherein the dielectric layer electrically isolates the conductive material from the protective mold structure.

3. The semiconductor package of claim 1,
   wherein the stepped structure is defined on a first portion of the side portion of the semiconductor die, and
   wherein the protective mold structure is disposed on at least a second portion of the side portion of the semiconductor die.

4. The semiconductor package of claim 1, further comprising a redistribution layer comprising at least a second dielectric layer disposed on the dielectric layer.

5. The semiconductor package of claim 4,
   wherein a portion of the second dielectric layer is disposed on the protective mold structure.

6. The semiconductor package of claim 1,
   wherein the protective mold structure comprises an epoxy mold compound.

7. A semiconductor package comprising:
   a semiconductor die comprising:
      semiconductor circuitry;
      a contact pad disposed on the semiconductor circuitry and in electrical contact with the semiconductor circuitry; and
      a passivation layer disposed on the semiconductor circuitry and on at least a portion of the contact pad;
   a dielectric layer disposed on the passivation layer and on a side portion of the semiconductor die;
   a conductive material disposed in electrical contact with the contact pad; and
   a protective mold structure disposed on the semiconductor die and a portion of the dielectric layer,
   wherein the dielectric layer is disposed on a top portion of the semiconductor die and on a stepped structure including a first step etched in the side portion of the semiconductor die, and
   wherein the dielectric layer is disposed between the protective mold structure and the stepped structure of the side portion of the semiconductor die.

8. The semiconductor package of claim 7, wherein:
   the dielectric layer is disposed on the stepped structure defined on a first portion of the side portion of the semiconductor die; and
   the protective mold structure is disposed on a second portion of the side portion of the semiconductor die.

* * * * *